US 6,579,786 B2

(12) United States Patent
Schmidbauer et al.

(10) Patent No.: US 6,579,786 B2
(45) Date of Patent: Jun. 17, 2003

(54) METHOD FOR DEPOSITING A TWO-LAYER DIFFUSION BARRIER

(75) Inventors: Sven Schmidbauer, Dresden (DE); Alexander Ruf, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/992,977

(22) Filed: Nov. 19, 2001

(65) Prior Publication Data

US 2002/0086527 A1 Jul. 4, 2002

Related U.S. Application Data

(63) Continuation of application No. PCT/DE00/01580, filed on May 17, 2000.

(30) Foreign Application Priority Data

May 17, 1999 (DE) .......................... 199 22 557

(51) Int. Cl.[7] ..................... H01L 21/20; H01L 21/4763; H01L 21/44
(52) U.S. Cl. ................. 438/618; 438/582; 438/618; 438/643; 438/652; 438/682; 438/685
(58) Field of Search ................ 438/618, 584, 438/643, 652, 682, 685

(56) References Cited

U.S. PATENT DOCUMENTS

| 5,273,775 | A | * | 12/1993 | Dyer et al. ................... 427/99 |
| 5,281,485 | A | | 1/1994 | Colgan et al. |
| 5,776,823 | A | * | 7/1998 | Agnello et al. ............. 438/592 |
| 5,893,752 | A | | 4/1999 | Zhang et al. |
| 5,968,333 | A | * | 10/1999 | Nogami et al. .............. 428/516 |
| 6,057,231 | A | * | 5/2000 | Givens et al. .............. 438/644 |
| 6,130,124 | A | * | 10/2000 | Lee .............................. 438/240 |
| 6,351,406 | B1 | * | 2/2002 | Johnson et al. ............. 365/103 |
| 6,362,099 | B1 | * | 3/2002 | Gandikota et al. .......... 438/687 |
| 6,372,301 | B1 | * | 4/2002 | Narasimhan et al. ....... 427/534 |
| 6,403,465 | B1 | * | 6/2002 | Liu et al. .................... 438/627 |
| 6,417,094 | B1 | * | 7/2002 | Zhao et al. ................. 438/627 |
| 2001/0018098 | A1 | * | 8/2001 | Sun et al. ................... 427/485 |
| 2002/0006468 | A1 | * | 1/2002 | Paranjpe et al. .............. 427/96 |
| 2002/0027286 | A1 | * | 3/2002 | Sundararajan et al. ...... 257/751 |

FOREIGN PATENT DOCUMENTS

| EP | 0 751 566 A2 | 1/1997 |
| EP | 0 758 148 A2 | 2/1997 |
| EP | 0 758 148 A3 | 8/1999 |
| JP | 09186157 | 7/1997 |
| WO | WO 98/54377 | 12/1998 |
| WO | WO 99/33110 | 7/1999 |

OTHER PUBLICATIONS

D. Edelstein et al.: "Full Copper Wiring in a Sub–0.25 $\mu$m CMOS ULSI Technology", IEEE, 1997, pp. 773–776.
Peijun Ding et al.: "Copper Barrier, Seed Layer and Planarization Technologies", ISMIC, 1997, pp. 87–92.

* cited by examiner

Primary Examiner—Amir Zarabian
Assistant Examiner—Ida M. Soward
(74) Attorney, Agent, or Firm—Laurence A. Greenberg; Werner H. Stemer; Ralph E. Locher

(57) ABSTRACT

A method for depositing a two-layer diffusion barrier on a semiconductor wafer consisting of a TaN layer and a Ta layer serving as a carrier layer for copper interconnects. The TaN layer is inventively deposited at temperatures above 200° C. in a first step, and the Ta layer is deposited in a second step while cooling the semiconductor wafer to a temperature below 50° C.

8 Claims, No Drawings

METHOD FOR DEPOSITING A TWO-LAYER DIFFUSION BARRIER

CROSS-REFERENCE TO RELATED APPLICATION

This application is a continuation of copending International Application No. PCT/DE00/01580, filed May 17, 2000, which designated the United States.

BACKGROUND OF THE INVENTION

Field of the Invention

The invention in general relates to a technique for depositing a two-layer diffusion barrier on a semiconductor wafer. In particular, the invention relates to a technique for depositing a diffusion barrier consisting of a tantalum nitride (TaN) layer and an overlying tantalum (Ta) layer as the carrier layer for interconnects, which are in particular copper interconnects of wiring planes.

Interconnects typically consist of wiring planes of microelectronic modules made of aluminum; however, this is limited with respect to the electrical conductivity and the realizable structural widths. For this reason, a new technology was developed for purposes of utilizing copper for the interconnects, the core idea of which is the dual damascene design, also known as the ticking design (D. Edestein, J. Heidenreich, R. Goldblatt, W. Cote, C. Uzoh, N. Lustig, P. Poper, T. McDevitt, W. Motsiff, A. Simoon, L. Su, S. Luce, J. Slattery, IEEE VLSI Tech. Symp. 1997). In this technique, the negative form of the junction hole and interconnect is etched in a planar silicon oxide layer of the intermetallic dielectric in a first step. A barrier and a copper start layer are deposited in this negative form by sputtering. The copper start layer can be deposited electrochemically or by Cu-PVD (Physical Vapor Deposition) or CVD (Chemical Vapour Deposition). Next, the entire negative form is electrochemically filled with copper at a low temperature. Because a completely planar surface is needed on the semiconductor wafer for the subsequent layer structure, the excess copper is then removed by chemical mechanical polishing (CMP), so that the junction holes and interconnects remain in the silicon oxide.

Because copper is utilized for the interconnects instead of aluminum, the copper must be completely encapsulated by corresponding barriers in order to prevent it from diffusing into the silicon or into the intermetallic silicon oxide.

At present, primarily single-layer systems consisting of titanium nitride, tantalum and tantalum nitride are known as diffusion barriers to silicon oxide (P. Ding, T. Chiang, R. Tao, B. Sun, I. Hashim, T. Yao, L. Chen, G. Yao, B. Chin, R. Mosley, Z. Xu, F. Chen; Conference Proceedings VMIC Conference, Jun. 10–12, 1997).

Attempts have also been made to utilize a two-layer system as a barrier, for instance a titanium nitride/tantalum system, in order to minimize the layer resistance of the overall barrier layer and thereby minimize the junction hole resistance and optimize the barrier stability by exploiting cumulatively advantageous morphological characteristics of the barrier structure, as described in Published European Patent Application EP 0 751 566 A2. In the event that a two-layer TaN/Ta system is utilized, besides the greater barrier stability due to a thin TaN layer under the tantalum layer, it is already possible to produce the low-impedance a-phase of the tantalum at temperatures around 200° C. Otherwise, this type of tantalum layer can be realized only at unacceptably high deposition temperatures above 400° C.

Another advantage of this two-layer barrier is that an optimal bond can be achieved with respect to both the silicon oxide and the copper.

Such two-layer systems are usually deposited in a PVD chamber at strictly prescribed temperatures. The temperature utilized for this is above 200° C., whereby the disadvantage of a deposition at such a high temperature is that the silicon wafer on which the barrier was deposited must then be cooled to a temperature below 50° C. The reason for this is that a copper start layer must be deposited at low temperatures, so that a conformal holeless copper film forms, and the copper does not agglomerate. The required cooling of the silicon wafer costs a great deal of time, which either limits the throughput of the sputter apparatus or raises the costs of the apparatus by an additional cooling chamber.

At present, in the process management which is provided for depositing a diffusion barrier deposit or seed deposit, the semiconductor wafer is pretreated in a degasifying or tempering step at >100° C. and then with argon at 250° C.–300° C. in a precleaning step. Immediately after that, the TaN layer and then the Ta layer are sputtered at approximately 250° C. Since the deposition of Cu must be conducted at low temperatures, the semiconductor wafer is cooled to 50°–25° in a subsequent processing step. This cooling process can also occur in a separate cooling chamber. Next, a copper start layer can be deposited at 25° C.

SUMMARY OF THE INVENTION

It is accordingly an object of the invention to provide a method for depositing the two-layer diffusion barrier on a semiconductor wafer which overcomes the above-mentioned disadvantages of the prior art methods of this general type. In particular, it is an object of the invention to provide a method for depositing a two-layer diffusion barrier on a semiconductor wafer, wherein it is possible to achieve substantial time savings without additional apparatus costs, while the quality of the layer deposition remains the same.

The inventive object is achieved with a method of the above described type by depositing the two-layer diffusion barrier in a two-step process wherein the TaN layer is deposited given a high wafer temperature in the first step, and then the Ta layer is deposited given a low temperature near room temperature.

With the foregoing and other objects in view there is provided, in accordance with the invention, a method for depositing a two-layer diffusion barrier on a semiconductor wafer, that includes steps of: providing a two-layer diffusion barrier on a semiconductor wafer; providing the diffusion barrier with a bottom TaN layer and an overlying Ta layer serving as a carrier layer for interconnects; and depositing the TaN layer in a high-temperature deposition step with a semiconductor wafer temperature above 200° C., and subsequently depositing the Ta layer in a low-temperature deposition step with the semiconductor wafer temperature below 50° C.

The semiconductor wafer may be treated first in a degasifying or tempering step prior to the deposition of the two-layer diffusion barrier in order to eliminate adsorbents. Then in a subsequent precleaning step, the metal oxide layer, which is situated in the floor of the junction holes, of a bottom metal track that sits uncovered there may be removed by a physical sputter effect.

In accordance with an added feature of the invention, the high-temperature deposition of the TaN layer is preferably performed at above 200° C., and the low-temperature deposition of the Ta layer is performed at below 50° C., for instance at 25° C.

In accordance with an additional feature of the invention, in order to be able to perform the two-layer deposition within an optimal time, the deposition of the Ta layer is performed during the cooling of the semiconductor wafer to a temperature below 50° C.

In accordance with another feature of the invention, the deposition of the TaN layer and the Ta layer is performed in a PVD deposition apparatus, whereby the deposition of the TaN layer is performed in a nitrogen atmosphere.

In accordance with a further feature of the invention, the deposition of the TaN layer and the deposition of the Ta layer are performed in the same PVD chamber. Following the degasifying and precleaning steps, when the wafer has a temperature of 200 to 300° C., the semiconductor wafer is placed in the PVD chamber on an Electro Static Chuck (ESC) that has been tempered to 25° C. without being chucked, and the TaN layer is deposited in the nitrogen atmosphere, with the excess nitrogen being pumped out following the successful deposition of the TaN layer. Next, the semiconductor wafer is chucked on the ESC, and the Ta layer is deposited in a nitrogen-poor atmosphere during the cooling to the low temperature.

Instead of the two-layer deposition of the diffusion barrier in one PVD chamber, it is also possible to deposit the TaN layer and the Ta layer in separate PVD chambers. To accomplish this, following the degasifying and precleaning step, when the semiconductor wafer has a temperature of 200 to 300° C., it is placed on an electrostatic chuck (ESC) that has been tempered to 250 to 300° C. in the first PVD chamber and chucked, and then the TaN layer is deposited in the nitrogen atmosphere. Next, the semiconductor wafer is chucked on an ESC which has been tempered to a temperature below 50° C. in a second PVD chamber, and the Ta layer is deposited during the cooling of the semiconductor wafer to the chuck temperature.

Since the semiconductor wafer already has the low temperature that is needed for depositing a copper start layer subsequent to the deposition of the second barrier layer, another embodiment of the invention provides that the semiconductor wafer, after being coated with the TaN and Ta layers, be coated immediately with a copper layer in a Cu-PVD chamber.

An essential advantage of the inventive method for depositing a two-layer barrier of TaN and Ta is that the deposition of the two layers can be performed in a substantially shorter time, whereby the overall layer resistance—that is to say, its morphology—hardly differs from a complete deposition of both layers at 250° C.

The inventive method is not limited only to utilization for producing diffusion barriers for a copper metallization, but rather is generally suitable for the formation of diffusion layers for preventing the diffusion of metals, in particular. Such metals include platinum, aluminum, or tungsten, for instance.

Other features which are considered as characteristic for the invention are set forth in the appended claims.

Although the invention is illustrated and described herein as embodied in a method for depositing a two-layer diffusion barrier, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

The invention will now be described in detail using two exemplary embodiments. The basic difference between the two exemplary embodiments is that in the first embodiment the TaN and Ta layers are deposited in the same PVD chamber, whereas in the second embodiment they are deposited in two separate PVD chambers.

In the deposition of the TaN and Ta layers in one PVD chamber, it is presumed that the semiconductor wafer is first pretreated by degasifying and precleaning processes as a matter of course. With the degasifying or tempering step, adsorbents are first dissolved from the wafer surface in vacuum conditions at approximately 300° C. In the subsequent precleaning step, the metal oxide layer of the exposed bottom metal interconnect in the floor of the junction holes is purposefully removed by a physical sputter effect, in order to achieve an optimally low junction resistance.

After these two processing steps, the silicon wafer already has a temperature of 200 to 300° C.

The semiconductor wafer is now led into the PVD chamber, whose electrostatic chuck is preferably tempered to a temperature below 50° C., preferably below 25° C. But because the TaN layer must be deposited at above 200° C., the semiconductor wafer is not chucked on the ESC, which precludes a strong thermal coupling between the semiconductor wafer and the chuck. Next, a thin TaN layer with a thickness of several 10's of nm is deposited in a nitrogen atmosphere (several mT N2). Because the wafer temperature is still 250 to 300° C. and can rise still higher due to the TaN deposition, the TaN layer is deposited with the desired morphology at the required temperature. After the deposition of the TaN layer, the excess nitrogen is pumped out of the PVD chamber, and at the same time the semiconductor wafer is chucked on the ESC. This produces good thermal contact between the semiconductor wafer and the chuck, so that the cooling of the wafer sets in immediately. Now the Ta layer is deposited with a sputter power of several kW, depending on the type of chamber. The advantage of this method is that the semiconductor wafer already exhibits the low temperature, below 50° C., that is required for the copper deposition at the end of the Ta deposition, without requiring additional cooling processes. Thus, after being coated with TaN and Ta, the cool silicon wafer can be immediately transferred into a Cu-PVD chamber or a CVD chamber, in which a copper start layer is initially deposited.

In the second exemplary embodiment, presently described, the deposition of the TaN and Ta layers are performed in separate PVD chambers. When two PVD chambers are utilized, the pretreatment of the semiconductor wafer is also performed as described above by degasifying and precleaning. The semiconductor wafer, which has a temperature of 250 to 300° that is achieved in the degasifying and precleaning steps, is moved into the first PVD chamber and is chucked on an ESC there. This ESC is tempered to a temperature of approximately 250 to 300° C. The semiconductor wafer thus remains controlled at a temperature of 250 to 300° C., so that the TaN layer, which is several 10's of nm thick, can be deposited in a nitrogen atmosphere. Next, the semiconductor wafer is led into the next PVD chamber, whose chuck has a temperature below 50° C., and the semiconductor wafer is chucked on the ESC. A good thermal contact between the ESC and the semiconductor wafer thus arises, so that the cooling of the semiconductor wafer to the chuck temperature begins with the chucking process. At the same time as the cooling of the semiconductor wafer, the Ta layer, also some 10 nm thick, is deposited. Because the semiconductor wafer is already at the low temperature which is required for the subsequent copper deposition at the end of the Ta deposition, the semiconductor wafer can be transferred to the Cu-PVD chamber or the CVD chamber immediately upon the deposition of the Ta layer, and the copper start layer can be deposited.

We claim:

1. A method for depositing a two-layer diffusion barrier on a semiconductor wafer, which comprises:

providing a two-layer diffusion barrier on a semiconductor wafer;

providing the diffusion barrier with a bottom TaN layer and an overlying Ta layer serving as a carrier layer for interconnects; and depositing the TaN layer in a high-temperature deposition step with a semiconductor wafer temperature above 200° C., and subsequently depositing the Ta layer in a low-temperature deposition step with the semiconductor wafer temperature below 50° C.

2. The method according to claim 1, which comprises providing the carrier layer for copper interconnects.

3. The method according to claim 1, wherein the low-temperature deposition step is performed at approximately 25° C.

4. The method according to claim 1, wherein the step of depositing the Ta layer is performed while cooling the semiconductor wafer to a temperature below 50° C.

5. The method according to claim 1, which comprises:

performing the steps of depositing the TaN layer and depositing the Ta layer a PVD deposition apparatus; and performing the step of depositing the TaN layer in a nitrogen atmosphere.

6. The method according to claim 1, which comprises:

performing the step of depositing the TaN layer in a PVD chamber;

depositing the Ta layer in the PVD chamber;

following a degasifying and a precleaning step, when the semiconductor wafer is at a temperature of 200–300° C., placing the semiconductor wafer in the PVD chamber on an electrostatic chuck, which has been tempered to approximately 25° C., without clamping the semiconductor wafer on the chuck, and depositing the TaN layer in a nitrogen atmosphere;

after depositing the TaN layer, pumping out excess nitrogen while clamping the semiconductor wafer on the electrostatic chuck; and depositing the Ta layer in a nitrogen-poor atmosphere while cooling the semiconductor wafer to a low temperature.

7. The method according to claim 1, which comprises:

subsequent to a degasifying and a precleaning step, when the semiconductor wafer has a temperature of 200–300° C., placing the semiconductor wafer in a first PVD chamber and clamping the semiconductor wafer on an electrostatic chuck that has been tempered to approximately 250–300° C.; and subsequently depositing the TaN layer in a nitrogen atmosphere in the first PVD chamber;

clamping the semiconductor wafer on another electrostatic chuck that has been tempered to a temperature below 50° C.; and depositing the Ta layer while cooling the semiconductor wafer to the temperature of the other electrostatic chuck.

8. The method according to claim 1, which comprises after depositing the Ta layer in the low-temperature deposition step, coating the semiconductor wafer with a copper start layer in a chamber selected from the group consisting of a CU-PVD chamber and a CVD chamber.

* * * * *